US007329948B2

(12) United States Patent
Sri-Jayantha et al.

(10) Patent No.: US 7,329,948 B2

(45) Date of Patent: Feb. 12, 2008

(54) MICROELECTRONIC DEVICES AND METHODS

(75) Inventors: Sri M. Sri-Jayantha, Ossining, NY (US); Gareth Hougham, Ossining, NY (US); Sung Kang, Chappaqua, NY (US); Lawrence Mok, Brewster, NY (US); Hien Dang, Nanuet, NY (US); Arun Sharma, New Rochelle, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 10/966,202

(22) Filed: Oct. 15, 2004

(65) Prior Publication Data

US 2006/0081979 A1 Apr. 20, 2006

(51) Int. Cl.
*H01L 23/10* (2006.01)
*H01L 23/34* (2006.01)

(52) U.S. Cl. ............................. 257/707; 257/E23.087; 257/706; 257/719; 257/720; 361/704; 361/705; 438/122

(58) Field of Classification Search ................ 257/706, 257/707, 704, 712, 713, 717, 720, E23.112, 257/E23.08, E23.102, E23.107, E23.087; 438/122; 361/704, 705, 715, 716
See application file for complete search history.

(56) References Cited

U.S. PATENT DOCUMENTS 5,387,815 A * 2/1995 Nishiguchi .................. 257/704
5,770,478 A * 6/1998 Iruvanti et al. ............. 438/122
5,773,362 A * 6/1998 Tonti et al. ................. 438/665
6,114,413 A * 9/2000 Kang et al. ................. 523/210
6,184,064 B1 * 2/2001 Jiang et al. ................. 438/113
6,186,768 B1 * 2/2001 Schmitt ...................... 425/550
6,206,997 B1 * 3/2001 Egitto et al. ................ 156/242
6,225,695 B1 * 5/2001 Chia et al. .................. 257/712
6,227,287 B1 * 5/2001 Tanaka et al. ............. 165/80.4
6,365,973 B1 * 4/2002 Koning ....................... 257/772
6,462,410 B1 * 10/2002 Novotny et al. ............ 257/707
6,523,608 B1 * 2/2003 Solbrekken et al. ........ 165/185
6,591,897 B1 * 7/2003 Bhatti et al. ............... 165/80.3
6,596,581 B2 * 7/2003 Park et al. .................. 438/253
6,627,988 B2 * 9/2003 Andoh ....................... 257/706
6,627,989 B2 * 9/2003 Kohno et al. ............... 257/706
6,678,168 B2 * 1/2004 Kenny et al. ............... 361/764
6,710,442 B1 * 3/2004 Lindgren et al. ........... 257/706
6,879,050 B2 * 4/2005 Thurgood et al. ........... 257/787
7,032,392 B2 * 4/2006 Koeneman et al. ............ 62/77
7,112,882 B2 * 9/2006 Lee ........................... 257/706
2003/0151132 A1 * 8/2003 Crippen ...................... 257/713
2006/0128068 A1 * 6/2006 Murray et al. .............. 438/120

* cited by examiner

*Primary Examiner*—Kenneth Parker
*Assistant Examiner*—Chris C. Chu
(74) *Attorney, Agent, or Firm*—F. Chau & Associates, LLC

(57) ABSTRACT

A microelectronic device is made of a semiconductor substrate, a heat generating component in a layer thereof, and a body within the remaining semiconductor substrate. The body is made of materials which have a high thermal inertia and/or thermal conductivity. When high thermal conductivity materials are used, the body acts to transfer the heat away from the substrate to a heat sink.

15 Claims, 11 Drawing Sheets

3
5

4
3y
6
2a
5
3x
6
5a 3
2b
5

3

4
3
3
7b
7c
7a
8
5
5a
1

Time=0.034 Contour: Temperature
mm x10^-4
mm x10^-3
$T_o$
$T_o+\Delta T$
$T_o+2\Delta T$
$T_o+3\Delta T$
3

Thermal Inertia (J/m^3)
x 10^6
6.8
6
5
4
3
2
1.6
[q*Cp]=2*[ ]-of-Copper
9
0
0.5
1
1.5
2
2.5
3
3.5
4
x 10^-3
(mm)
q*Cp
X 10 ms
50 W/cm2
25 ms
5x50 W/cm2
T
15 ms
50 W/cm2
q*Cp=2*[ ]-of-Copper
k=copper
q x Cp=2*copper
10a
10b
87.2
86
85.1
84
82
80
78
76
74
T(deg.C)
0
0.01
0.02
0.03
0.04
0.05
Time (s)

5x50 W/cm2
50 W/cm2
30 ms
70ms
T(deg.C)
Time (s)
11a
11b 10 ms
50 W/cm2
5x50 W/cm2
25 ms
15 ms
t=34 ms
t=10 ms
12a
12b
T
4
8
5
Z
3
7a
7b
7c
X
(mm)
(T deg. C)
Temp
0
0.5
1
1.5
2
2.5
76
78
80
82
84
86

13a
13b
t=34 ms
t=10 ms
(T)
(mm)
7a
7b
3
5
8
4
z
x

MICROELECTRONIC DEVICES AND METHODS

FIELD OF THE INVENTION

The present invention relates to novel microelectronic devices with improved thermal properties and to methods to make same.

BACKGROUND OF THE INVENTION

Heat dissipation in a microelectronic device, such as a microprocessor results in high operating temperature of its semiconductor (e.g. Silicon) substrate. It requires creative means of cooling in order to contain substrate's temperature. The thermal flux density (Watts/m2) has both spatial and temporal (time) dependence. Present microprocessors dissipate about 30-40 Watts/cm2. Thermal flux density at a location has a steady component due to leakage current and a dynamic component (often with transients or spikes) due to application driven digital switching. Typical thermal flux density is non-uniformly distributed over a chip. The thermal flux density over a "hotspot" can be 5 times higher than the remaining area on a chip. As cooling of a microprocessor becomes increasingly difficult under high power environment, the need to manage complex temperature distribution of a chip becomes even more critical.

Reliability of microelectronic devices, such as microprocessors, is known to be affected by the operating temperature of its substrate. Under steady temperature condition it has been shown that the life time of a microelectonic device is exponentially reduced with an increase in its temperature. However, the effect of temperature variations on reliability is not well established. Nevertheless, controlling the temperature variation as well as steady temperature of a microprocessor chip below a target temperature is much preferable to a case with more extreme fluctuations.

A silicon substrate of a microelectronic device may, for example, be 500-700 μm thick with an area spanning about 2 cm×2 cm. The circuit elements are often fabricated on one side of the surface and within a total thickness of about 100 μm from the substrate surface. The substrate has a "top surface" on to which a cooling device is attached and a "bottom surface" on which the microelectronic circuits are built. A microprocessor includes a number of the microelectronic circuits including several logical units, such as floating point, load-store-registers, etc., that perform the necessary digital operations. Among these logical units, a subset is known to produce more heat flux than others. During a transient periods of operation of these logical units, the local temperature at these units can exceed the temperature of the neighboring elements for short periods of time. More than 80% of the heat generated by circuit elements, such as these logical units, travel through the bulk thickness of the silicon substrate towards a cooling device such as a heat spreader or a heat sink. Present commercial products envisage minimizing the resistance to heat transfer by thinning the silicon. However, to maintain robustness of a chip it is important to maintain a minimum thickness to avoid damage due to internal and external mechanical stresses.

The invention provides a solution to improving the thermal characteristics of a chip by modifying the thermal properties of a substrate (for example, silicon) without interfering with the chip process technology or reducing the robustness of the chip.

A via hole is a cavity (often cylindrical) which extends, partly into or completely through, an insulating or semiconducting substrate. A blind via hole is a via hole that extends partly into the insulating or or semiconducting substrate. For the purpose of the present invention, a via is a conducting body formed by a via hole which contains at least a partial filling of electrically or thermally conducting material.

SUMMARY OF THE INVENTION

The invention broadly and generally provides a microelectronic device comprising: (a) a semiconductor substrate; (b) a heat generating component disposed in a layer of said semiconductor substrate; and (c) a body disposed in the aforesaid semiconductor substrate and outside the aforesaid layer; the aforesaid body comprising a material selected from a first material having a thermal inertia substantially higher than that of the aforesaid semiconductor substrate and a second material having a thermal conductivity substantially higher than that of the aforesaid semiconductor substrate, the aforesaid second material being in substantial thermal communication with a cooling device (e.g., a heat sink).

According to a preferred embodiment, the microelectronic device further comprises (d) a barrier layer disposed between the aforesaid silicon substrate and the aforesaid body, wherein the aforesaid barrier layer is operable to shield against electrical interference with functioning of the aforesaid microelectronic device. To minimize such electrical interference, the aforesaid body may be disposed in spaced adjacency to the location of the aforesaid heat generating component.

Moreover, it is desirable that the aforesaid body comprise a material having thermal expansion properties substantially similar to those of the aforesaid semiconductor substrate. As an alternative way to accommodate differences in thermal expansion properties, the aforesaid body may comprise a porous material. The aforesaid body may also be enclosed within the aforesaid semiconductor substrate.

The invention further broadly and generally provides a method of making a microelectronic device, aforesaid microelectronic device comprising a semiconductor substrate and a heat generating component disposed in a layer thereof, the aforesaid method comprising: (a) providing a cavity (e.g. a blind via hole) in the aforesaid semiconductor substrate and outside the aforesaid layer (as by etching); and (b) filling the aforesaid cavity with a body containing a material selected from a first material having a thermal inertia substantially higher than the aforesaid semiconductor substrate and a second material having a thermal conductivity substantially higher than the aforesaid semiconductor substrate, the aforesaid cavity, when filled with the aforesaid second material, being operable for substantial thermal communication to an adjacent cooling device (e.g. a heat sink).

Preferably, the method further comprises providing a layer of TaN coating to cavity walls before the aforesaid filling step (b).

DETAILED DESCRIPTION OF PREFERRED EMBODIMENT

As will be understood, the invention utilizes the volume of the semiconductor substrate to enhance thermal properties of the microelectronic device without interfering with the functioning of the microelectronic circuits at the bottom layer (5*a* in FIG. 5) of the substrate. The unused volume is disposed between top surface of substrate (5 in FIG. 5) and about 50 μm away from the bottom layer 5*a*. No modification of the bottom layer 5*a* that carries the microelectronic devices is required to practice this invention. By embedding a body 3 (filled with a material containing particles made of various components with enhanced thermal properties) in a silicon substrate 5, the thermal performance of a microprocessor system is enhanced by the invention. For holding the filling material, the cavity (sometimes referred to as a trench or a blind via hole), is formed through an etching process or any suitable fabrication method. A barrier layer comprising TaN is preferably applied on the walls of the cavity to eliminate ionic migration of filling material into the bulk of the silicon thus preventing degradation of performance of an adjacent circuit or device. The shape and location of the cavities are chosen accordingly. One simple case of a cavity or trench would be a blind cylindrical via replicated uniformly over the silicon, as in FIG. 3*a*. (For example, in a silicon chip with 500 μm thick substrate, a via with a diameter of 100 μm could penetrate as deep as 450 μm) The filling or "matrix mass" consists of thermal inertia and thermal conductivity enhancing particles (e.g. a combination of diamond, aluminum, chromium) coated with copper so that selected desirable properties are tailored to the application. In particular, the coefficient of thermal expansion (CTE) of the filling may be matched to that of silicon. The resulting composite structure built on silicon with filled via holes has superior thermal properties without loosing its robustness.

Figure 3A:
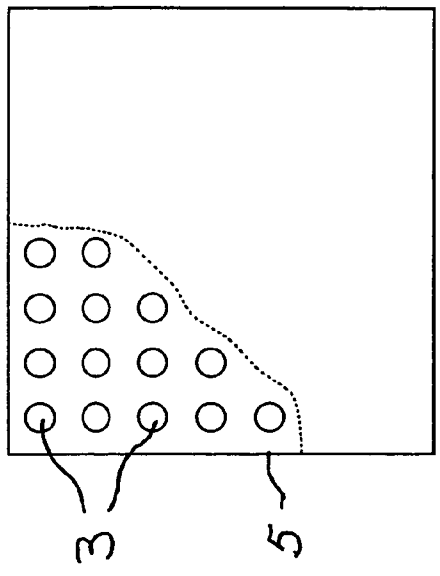
FIG. 3*a* is a schematic plan view of part of a substrate with thermal property enhancing bodies.
Figure 3C:
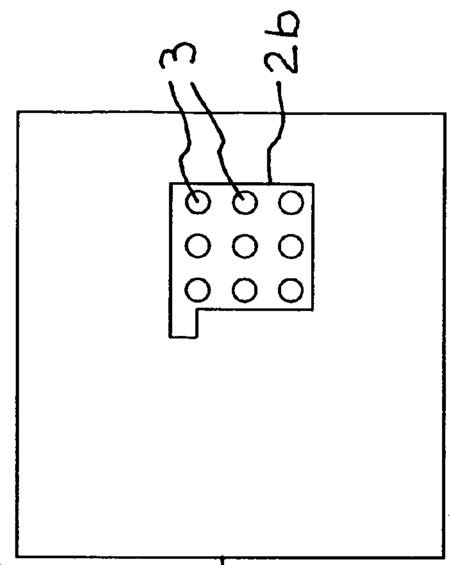
FIG. 3*c* is a schematic plan view of a substrate having thermal property enhancing bodies within the region of a logical unit, that generates heat.

A unique cavity configuration can correspond to a dense distribution of vias deployed along strategically chosen locations, for example, directly above the heat generating units, as in FIG. 3*c*. Cavities in the form of vias can have "hexagonal" cross-section (as in FIG. 3*b*) thus resembling a "honeycomb" structure known to have rigidity.

Figure 2A:
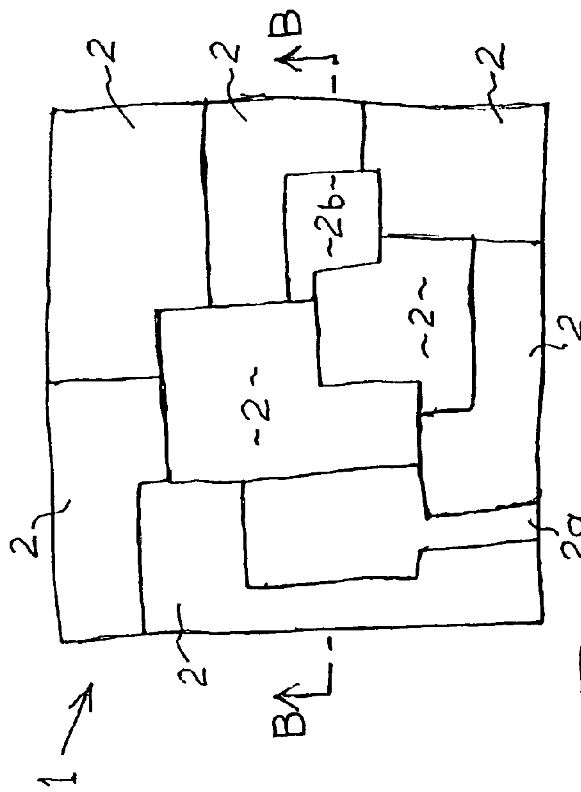
FIG. 2*a* is a schematic plan view of a microelectronic device in accordance with the present invention.
Figure 2B:
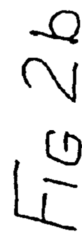
FIG. 2*b* is a schematic cross-sectional view taken along cross-section B-B of FIG. 2*a*.
Figure 1A:
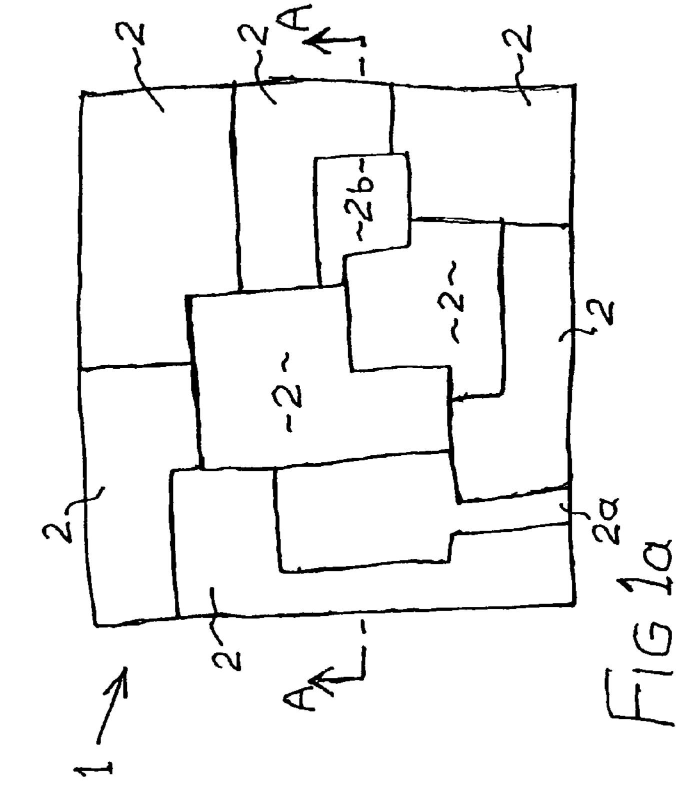
FIG. 1*a* is a schematic plan view of a microelectronic device in accordance with the prior art.
Figure 1B:
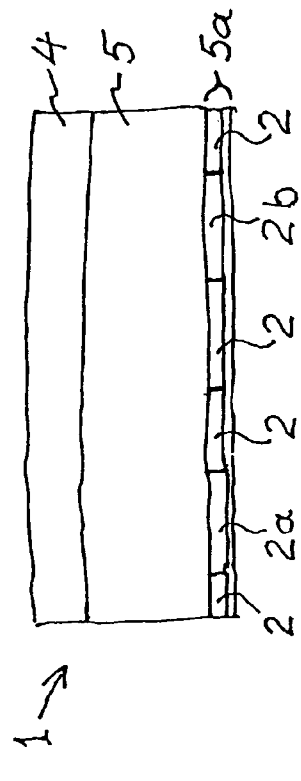
FIG. 1*b* is a schematic cross-sectional view taken along cross-section A-A of FIG. 1.

FIGS. 1*a* and 1*b* show the prior art microelectronic device 1 in the form of a microprocessor with heat generating components in the form of logical units 2, 2*a*, and 2*b*. The cross-sectional view in FIG. 1*b* represents a simple silicon substrate 5. FIGS. 2*a* and 2*b* show the novel microelectronic device covered by this invention. Among many logical units 2, the invention shows a case where, for example, two units 2*a* (e.g. floating point unit or FPU) and 2*b* (e.g. load-store-register or LDST) benefit from the enhanced thermal inertia/conductivity regions 3*a*, 3*b*. A thin layer of TaN coating may be placed on the walls of regions or trenches 3*a*, 3*b* to prevent ionic/atomic migration, which could interfere with electronic functioning of logical units 2*a*, 2*b*.

Figure 2C:
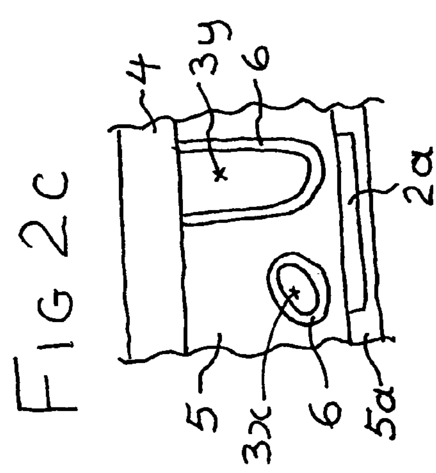
FIG. 2*c* is a schematic cross-sectional view of a semiconductor substrate constructed with thermal property enhancing bodies, in spaced adjacency to a heat generating component of a microelectronic device, in accordance with embodiments of the inventions.

FIG. 2*c* shows another cross-section of a thermal-property-enhancing substrate 5 with a heat sink 4, and a heat-generating component 2*a* (e.g. an FPU) and two bodies 3*x*, 3*y* disposed in substrate 5. As can be seen, bodies 3*x* and 3*y* are located in spaced adjacency to component 2*a*—close enough so that they can quickly draw away heat from component 2*a* but far enough away so that the capacitance of bodies 3*x* and 3*y* does not interfere with the electronic functioning of component 2*a*. A good compromise is about 50 μm. A layer 6 of TaN is applied to reduce the electronic interference through ionic migration. Moreover, body 3*x* is isolated within substrate 5 and is filled with a first material having a thermal inertia substantially higher than the substrate 5. On the other hand, body 3*y* is connected thermally and directly to heat sink 4 and is filled with a second material having a thermal conductivity substantially higher than that of substrate 5.

Figure 3B:
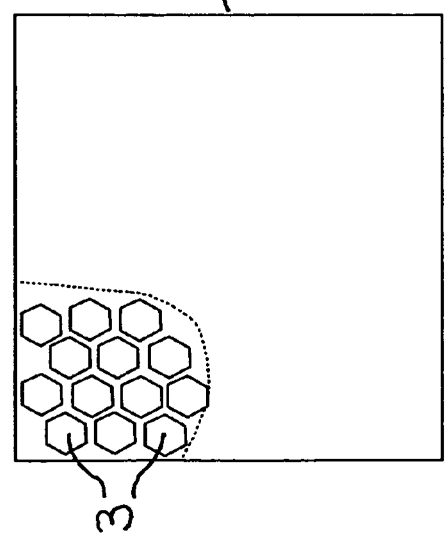
FIG. 3*b* is a schematic plan view of a substrate with hexagonal thermal property enhancing bodies.

FIG. 3*a* corresponds to a uniformly distributed cylindrical vias. FIG. 3*b* shows a hexagonal via forming a honeycomb structure. FIG. 3*c* shows a localized distribution of vias 3 adjacent to a logical unit such as LDST 2*b*. A combination of these configurations can be used to achieve a final chip design.

Figure 5:
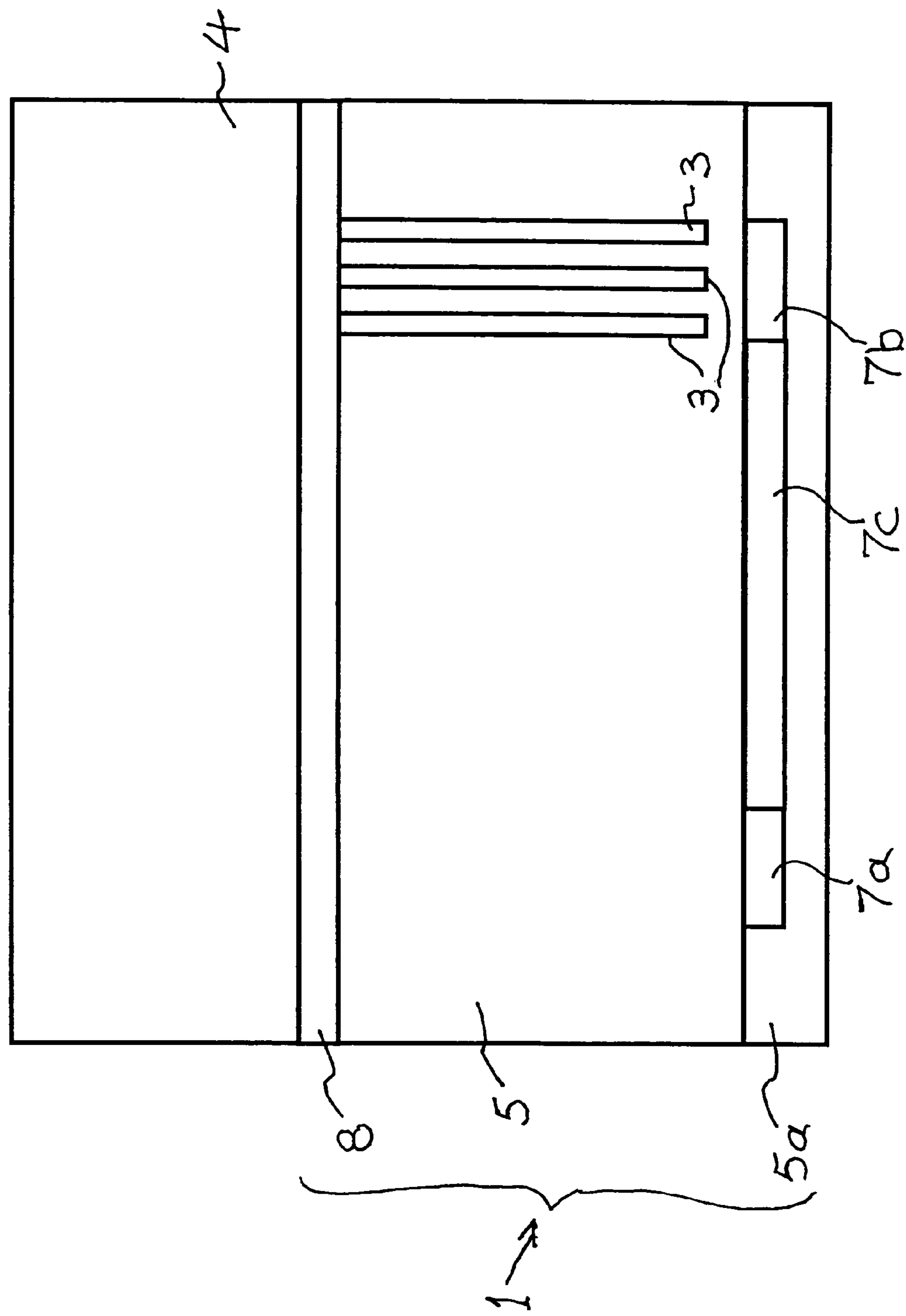
FIG. 5 is a schematic cross-sectional view of a microelectronic device having two heat generating components, or "heat sources," one of which is in substantial thermal communication with bodies comprising via holes filled with thermal property enhancing material.

FIG. 5 shows a schematic of a substrate using the thermal enhancement of the present invention as a microelectronic device portion of a larger silicon chip. FIG. 5 shows two concentrated variable heat sources 7*a*, 7*b*, each 500 μm wide and 50 μm deep. In between the sources 7*a*, 7*b* of varying heat, a source of constant heat 7*c* generating (2 mm wide) is constructed. The silicon substrate 5 may, for example, be 500 μm thick, and is attached to a cooling device, such as a heat sink or copper block 4 using a thermally conductive interface material 8 (e.g. 50 μm thick). The combined thickness of the microelectronic device 1 (excluding the copper block 4) is less than 1 mm and the width may be 4 mm, for example.

Figure 6:
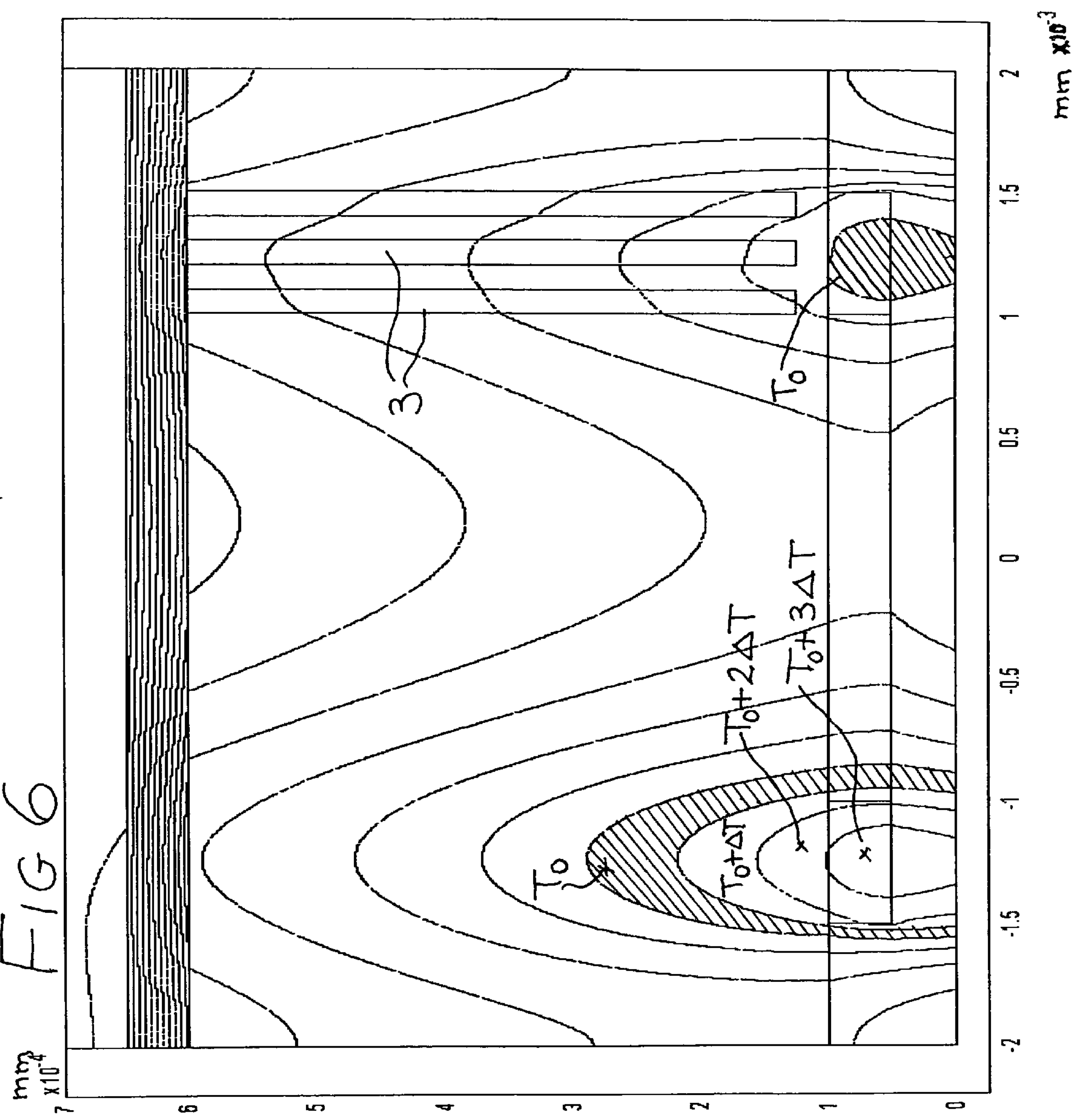
FIG. 6 is a schematic cross-sectional view of the microelectronic device shown in FIG. 5, further depicting contour lines to represent the lower temperature of heat generating components near the thermally enhanced portion of the substrate 34 ms after a 25 ms pulse of heat generating activity.

To compare the effect of thermal vias on transient temperature distribution three 100 μm wide vias 3 with 450 μm depth are constructed in accordance with FIG. 5. FIG. 6 shows an instantaneous temperature distribution after 34 ms. The substrate with enhanced thermal properties functions to cool the logical unit to temperature $T_0$, while the temperature of the logical unit near the unmodified substrate remains as high as $T_0+3\Delta T$ with a substantially larger region having a temperature of at least $T_0$. The example shows that the transient temperature can be positively reduced by locally increasing the thermal inertia. As discussed later the thermal property can be tailored using a mixture of special components so that the thermal advantage can be enhanced accordingly.

Figure 7:
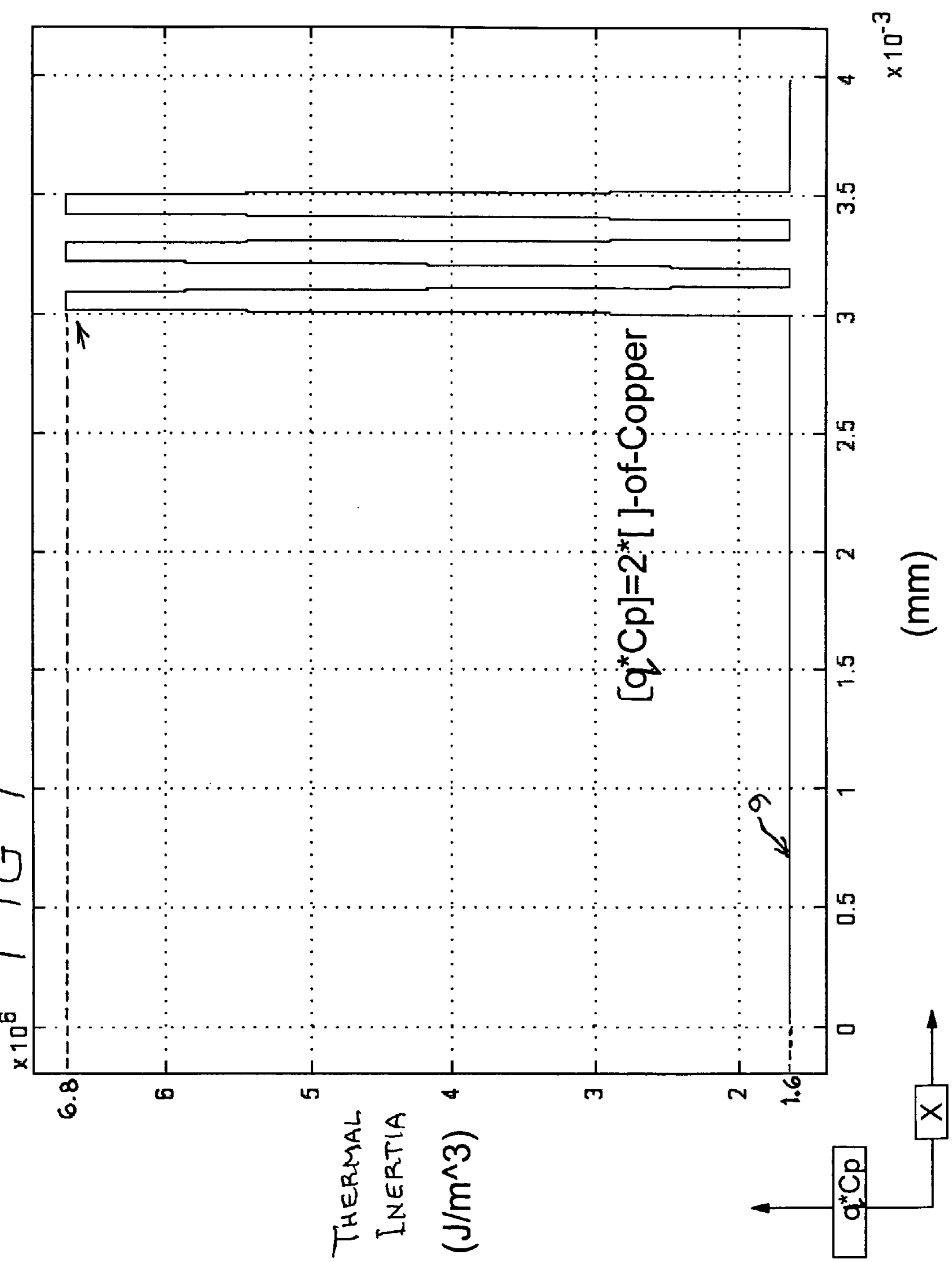
FIG. 7 is a graph indicating the thermal capacitance of the substrate measured across the substrate of the microelectronic device of FIG. 5.

In one example, the thermal inertia of the vias, as measured by "density(q)*specific heat(Cp)", is increased by a factor of 2 greater than that of copper. Conductivity of the via filling was kept equal to that of copper. FIG. 7 shows the distribution of thermal inertia across the silicon substrate. Compared to silicon the inertia is increased by a factor of 4.

Figure 8:
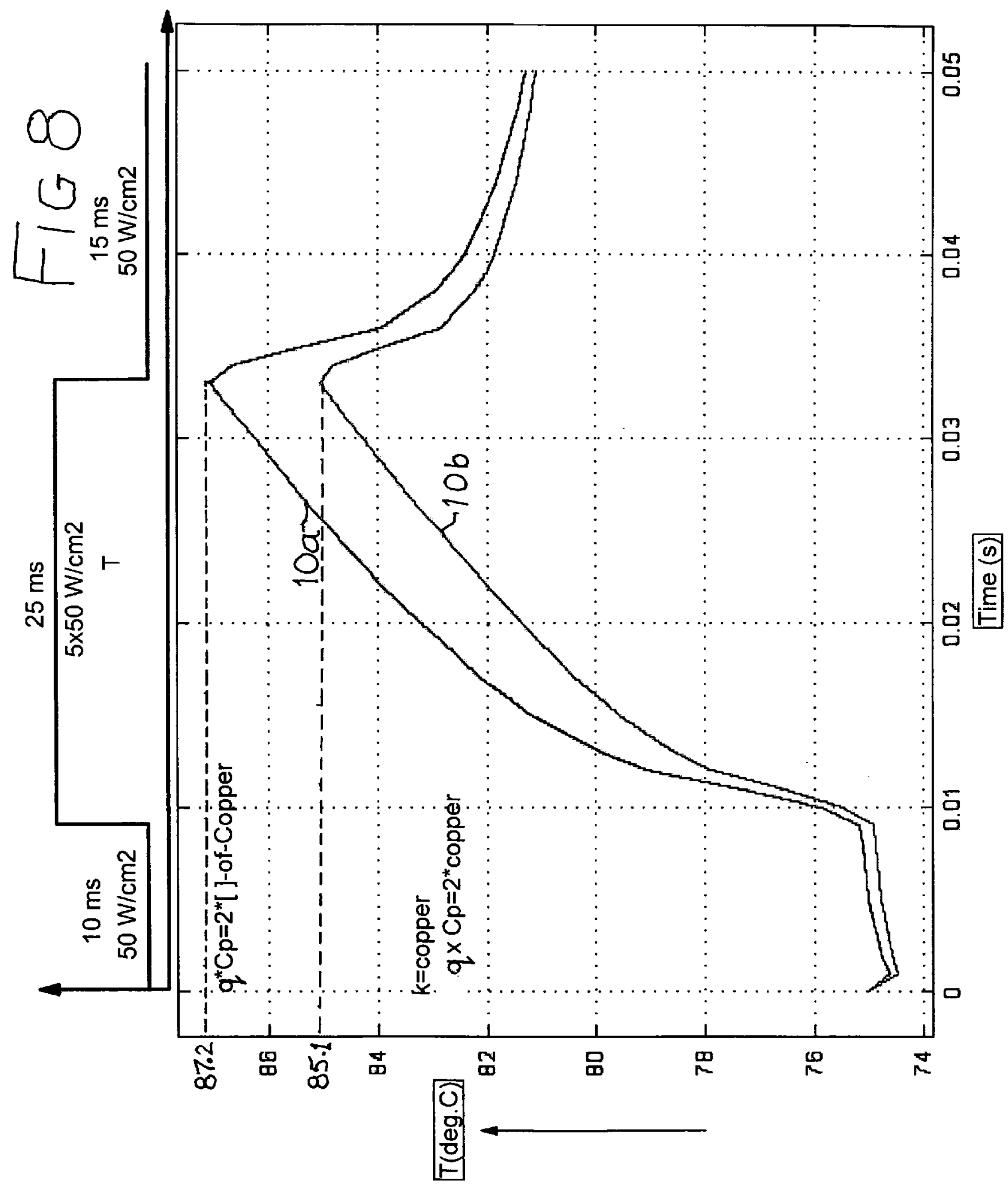
FIG. 8 is a graph indicating the transient temperature observed at the two heat sources of FIG. 5 before, during, and after a 25 ms pulse of heat generating activity.

FIG. 8 shows the effect of thermal enhancement when a current pulse with 25 ms duration and 5 times the DC power (50 W/cm2) dissipation is applied to the two heat sources 7*a*, 7*b* of FIG. 5. FIG. 8 shows the transient temperature observed at two similar locations within the heat sources. At the end of 25 ms pulse, a temperature difference of about 2 deg C. can be observed. Simple silicon region (without vias) rises to 87 deg C. whereas the region with vias reaches about 85 deg C.

Figure 9:
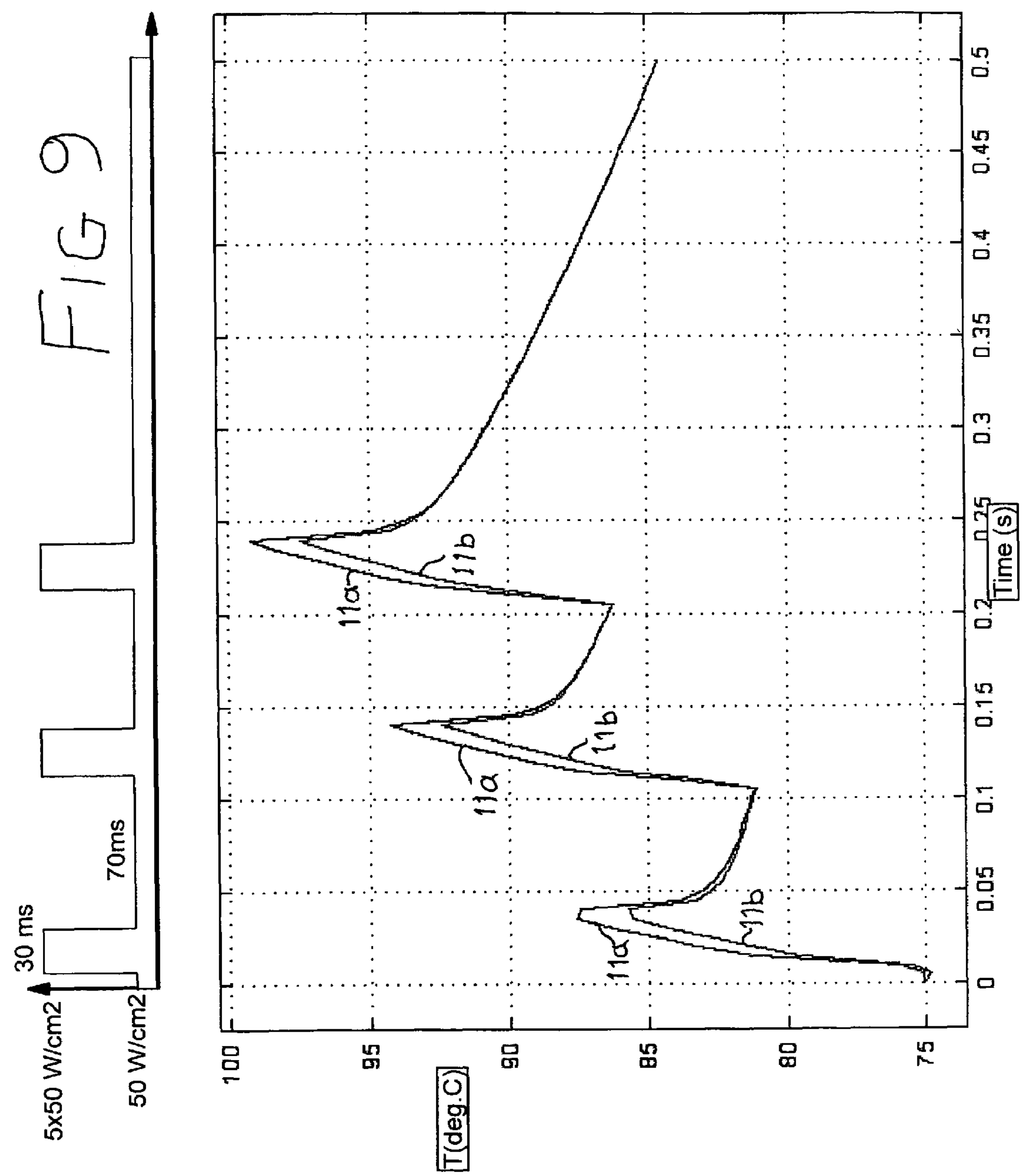
FIG. 9 is a graph showing three consecutive pulses of the type shown in FIG. 8, separated by 70 ms intervals.

FIG. 9 is similar to that of FIG. 8 with AC component is repeated 3 times at 70 ms intervals. Each pulse elevates the silicon temperature, but the relative difference between peak values are maintained by the increase in thermal inertia.

Figure 10:
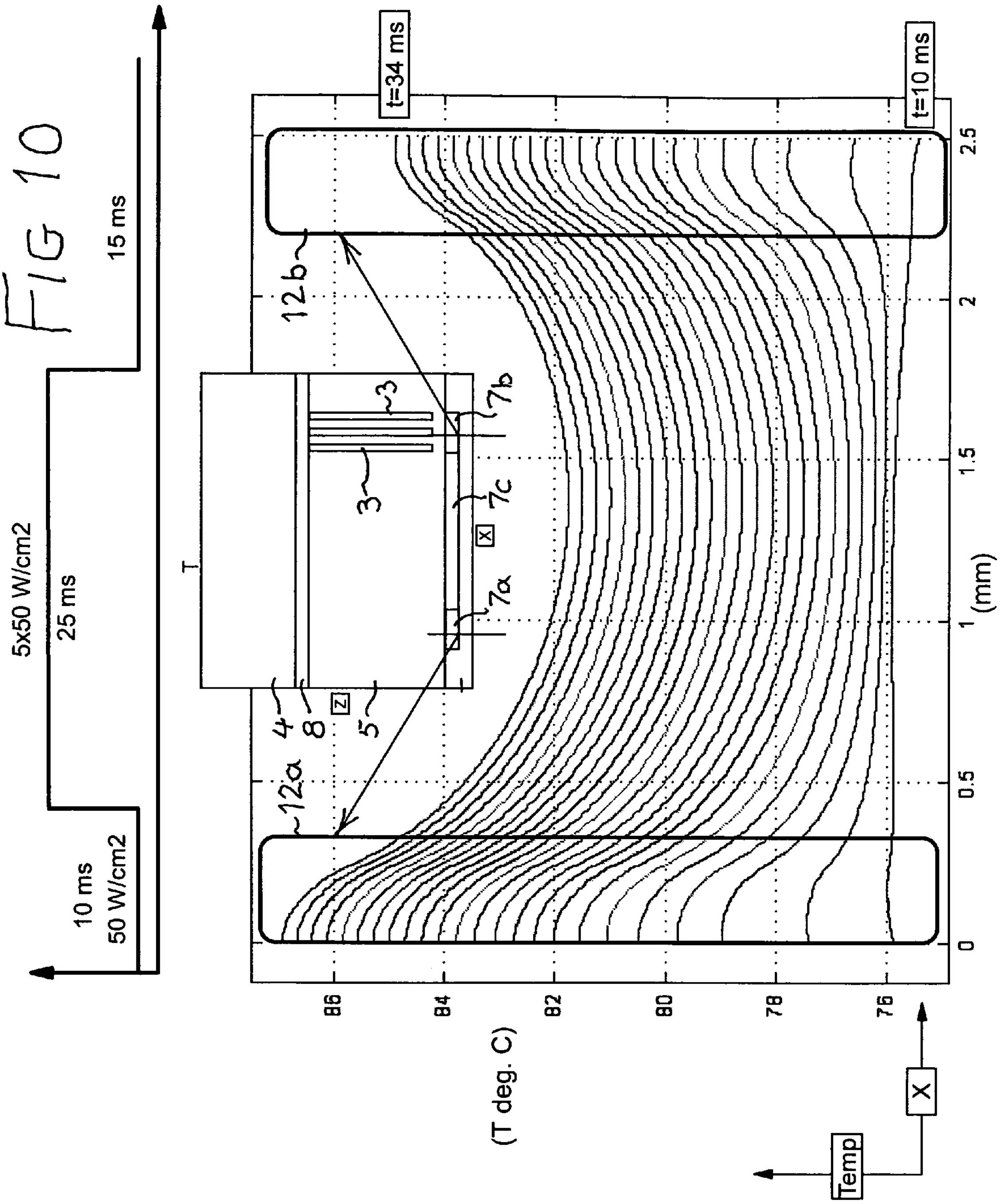
FIG. 10 is a graph showing a family of temperature plots along a horizontal line that passes through both heat sources as time increases from 10 to 34 ms following a pulse of heat generating activity.

FIG. 10 shows a family of temperature plots along a horizontal line (along X-axis) that passes through both heat sources 7*a*, 7*b* (10 μm away from the bottom silicon surface into the devices where the temperature driven reliability matters.) The traces show the evolution of temperature as time increases from t=10 ms (on set of AC power pulse) to t=34 ms. Presence of thermal vias near 2.5 mm reduces the rate of temperature rise by absorbing the heat flux under dynamic heating.

Figures 11A, 11B:
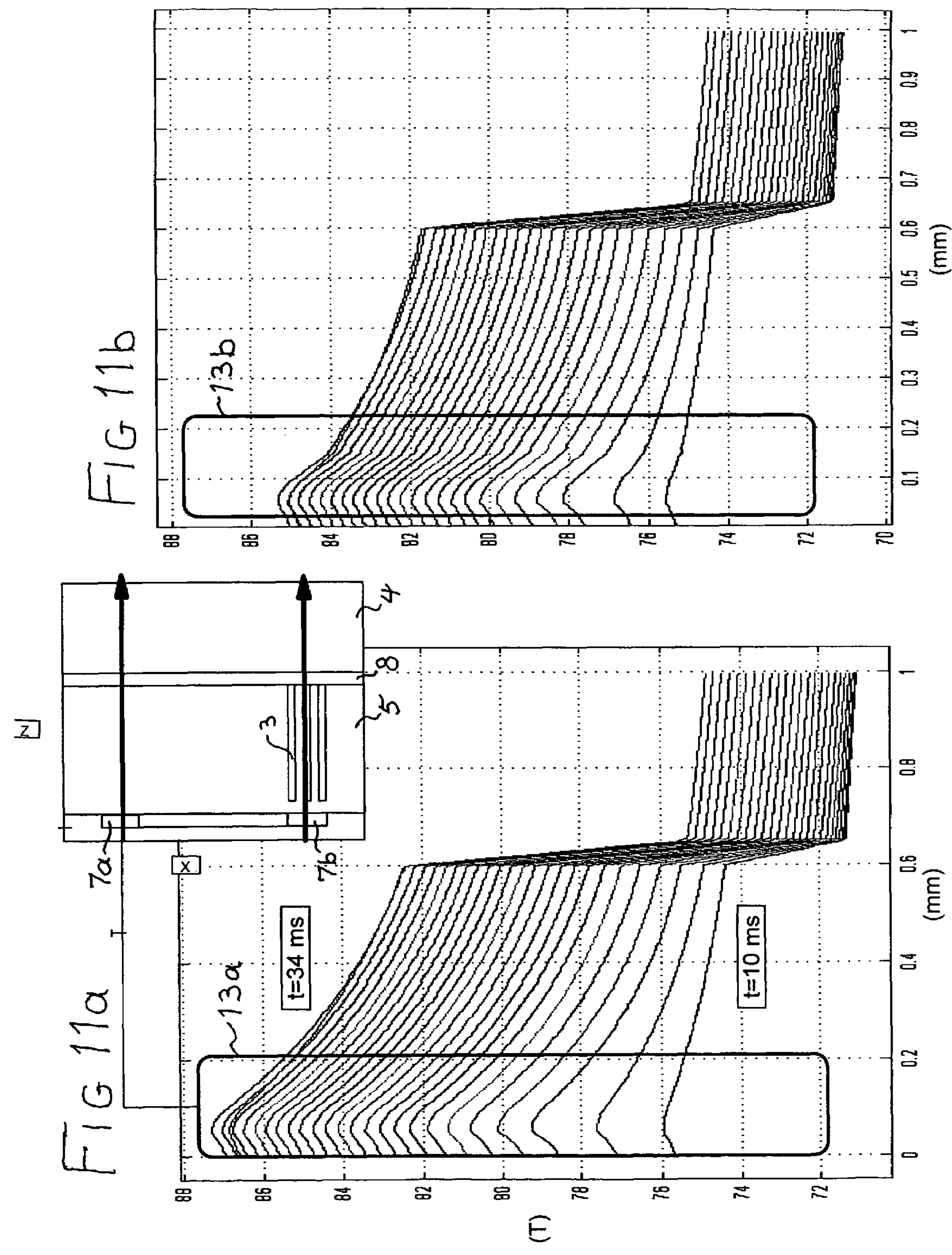
FIG. 11*a* is a graph showing the temperature distribution across the depth of the microelectronic device at successive time instances, where thermal property enhancing materials have not been used.
FIG. 11*b* is a graph showing the temperature distribution across the depth of the microelectronic device at successive time instances, where thermal property enhancing materials have been used.

FIGS. 11*a*, 11*b* shows the temperature distributions across the depth of silicon (along the Z-axis at successive times between 10 ms and 34 ms) to compare the effect of the absence (FIG. 11*a*) and presence (FIG. 11*b*) of bodies 3.

Figure 12B:
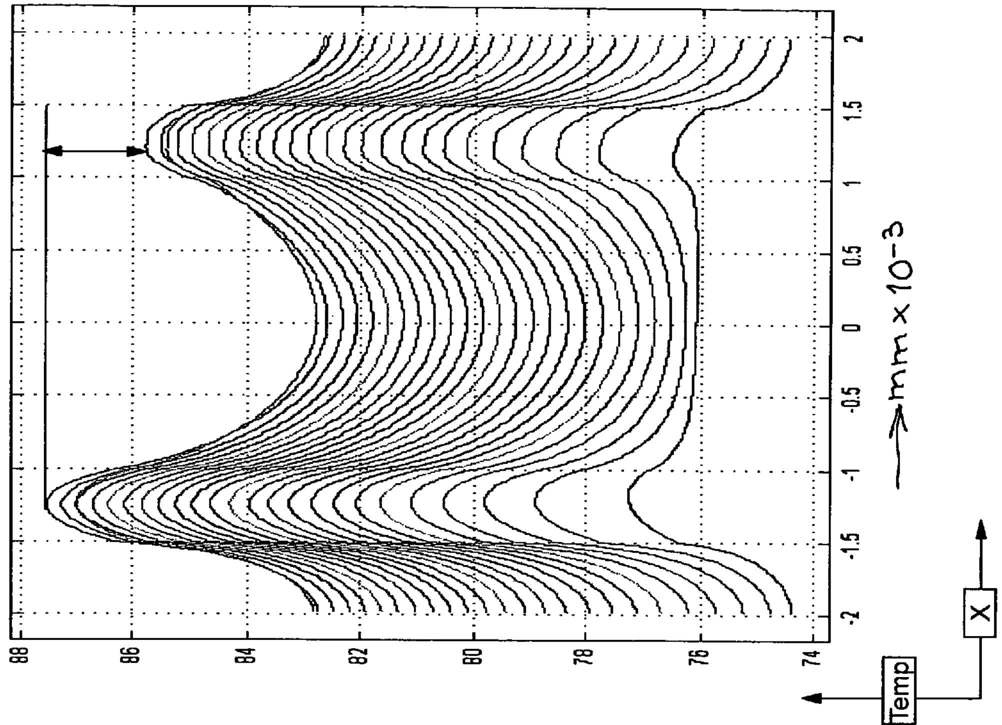
FIG. 12*b* is a graph indicating the temperature, over time, of a right-hand substrate portion which has been enhanced with material having a high thermal conductivity as compared to a left-hand substrate portion which has not been enhanced.
Figure 12A:
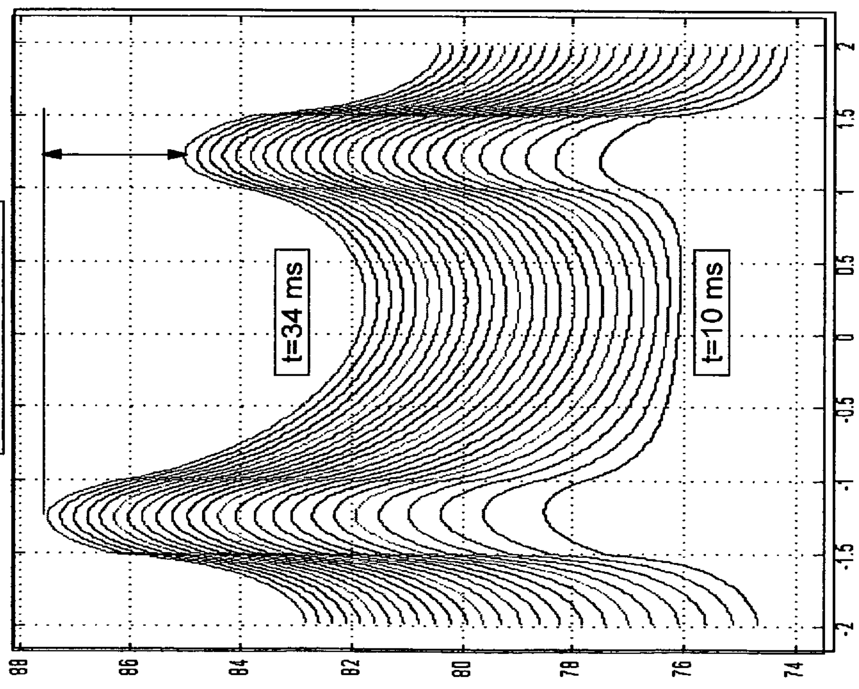
FIG. 12*a* is a graph indicating the temperature, over time, of a right-hand substrate portion which has been enhanced with material having a high thermal inertia as compared to a left-hand substrate portion which has not been enhanced.

FIGS. 12*a*, 12*b* compares the effect, over time t=10 ms to t=34 ms, of keeping one property of the via filling equal to that of silicon and making the other 8 times that of silicon. FIG. 12*a* corresponds to heat capacity being made 8× while keeping k at 1×. FIG. 12*b* corresponds to capacity at 1× and k at 8×. In both cases a differential advantage of about 2 deg C. is seen. Also observe that in FIG. 12*a* (for the high thermal inertia material) due its proximity to plain silicon region, absorbs the temperature rise of the plain silicon (left hand region), thereby reducing the temperature differential that can be demonstrated by this invention. This characteristics nevertheless is a positive attribute of the invention where nearby regions are positively influenced by the presence of thermally modified material.

The concept of thermal vias has been discussed above. Potential methods for fabricating such vias will be discussed next.

It is desirable that substitution of silicon with a material of higher heat capacity should not cause the silicon to crack from mismatches of thermal expansion coefficients (CTE).

The general approach will be to use reactive ion etching (RIE) to form a hollow cylindrical cavity 3 (as in FIGS. 4*a*, 4*b*) from the back of the active Si extending toward layer 5*a* (see FIG. 5) and fill the cylindrical cavity 3 with a low CTE composite 3*x*, 3*y*, 4*a*. This composite must have the additional property of high heat capacity, and should not sacrifice the high thermal conductivity. One strategy is to use mixed metal-coated powders as a precursor to the via composition. The powders would be added by one of several possible methods, and would then be sintered to form a continuous fused solid or porous solid. For the purposes of illustration, it will be assumed that the metal will be injected into cylindrical hollows of the Si in a paste form, dried, and then sintered.

Figure 4B:
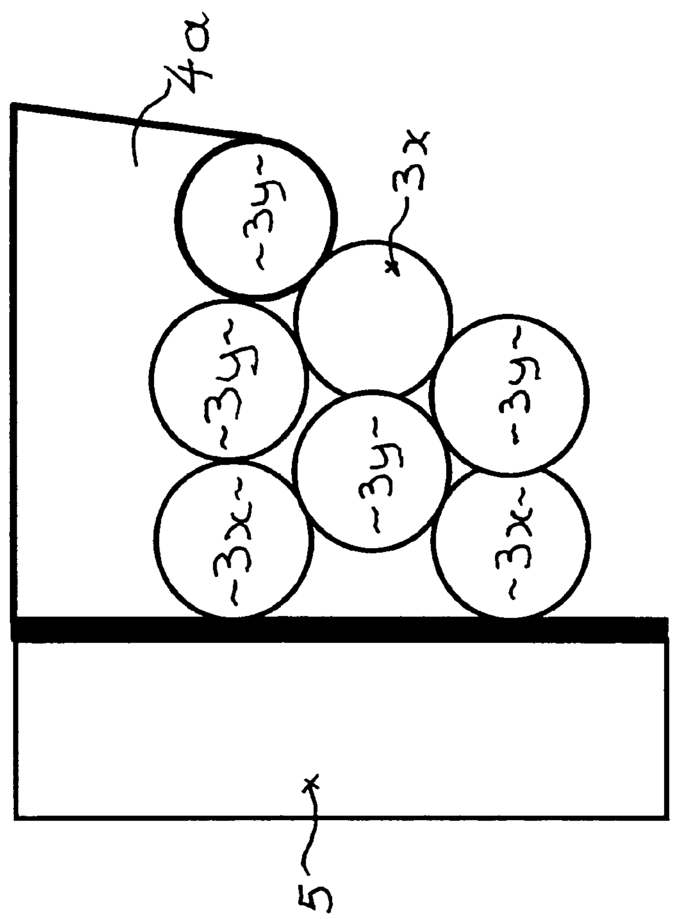
FIG. 4*b* is a schematic enlarged view of the area bounded by rectangle 3*c* in FIG. 4*a*.
Figure 4A:
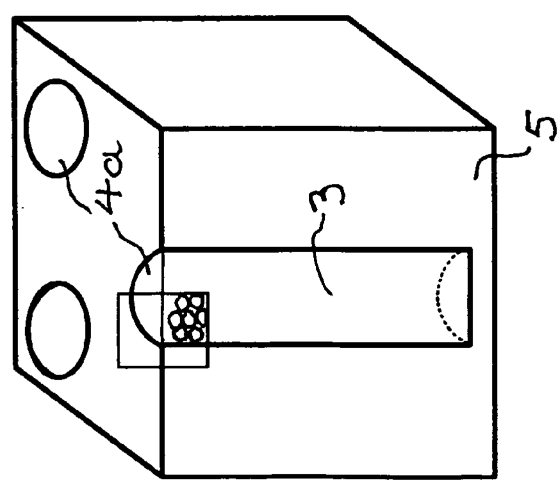
FIG. 4*a* is a schematic plan view displaying a localized region having bodies that provide thermal property enhancement.

FIG. 4*a* shows a schematic diagram of a via in Si filled with a porous, but continuous metal networked composite. The porosity is desirable for adding additional modes of stress relief during thermal excursions. However, there may be geometries where non-porous metal columns could be compatible with Si without the introduction of porosity, which would eliminate the sealing steps needed for porous materials.

The FIG. 4*b* enlargement shows three material components that make up the final composite filling. Component 3*x* consists of a material with a high volumetric heat capacity, Cv. Component 3*y* consists of a material with a high thermal conductivity. And component 4*a* (matrix) consists of a material that will act as the common binder. This matrix 4*a* must have desirable sintering properties and high thermal conductivity. The exact choice of these materials depends on both the desired end-properties and on the processing constraints imposed by the front-side device.

The table below illustrates the thermal properties of a variety of metals that can be used to constitute the composite. The 3*x* component must have high Cv (=q Cp) and low CTE. The 3*y* component must have high k and low CTE. The 4*a* component must have high k as well as sinterability within a process compatible temperature range. It is further desirable that the 3*x* component have a high k value, but not at the expense of the high Cv value.

| Material | [qCp] (J/K-cm3) | k (W/m-K) | CTE (ppm) |
|---|---|---|---|
| W | 2.54 | 170 | 4.5 |
| Mo | 2.58 | 139 | 4.8 |
| Cr | 3.19 | 94 | 4.9 |
| Nd | 1.29 | 17 | 9.6 |
| U | 2.21 | 27 | 13.9 |
| Bi | 1.19 | 8 | 13.4 |
| Cu | 3.42 | 400 | 16.5 |
| Au | 2.49 | 320 | 14.2 |

-continued

| Material | [qCp] (J/K-cm3) | k (W/m-K) | CTE (ppm) |
|---|---|---|---|
| Pt | 2.79 | 72 | 8.8 |
| Ni | 3.96 | 91 | 13.4 |
| Ir | 2.95 | 150 | 6.4 |
| Ta | 2.33 | 57 | 6.3 |
| C | 1.11 | 150 | 7.1 |
| Si | 1.64 | 150 | 2.3 |

One preferred embodiment is a composite consisting of 3$x$=copper coated Molybdenum, 3$y$=copper coated diamond, and 4$a$=small pure copper. This can be formulated into a paste with a suitable solvent/surfactant combination and then injected into the empty vias. This structure can then be sintered at a high temperature to form the composite via filling. It would have a CTE that was roughly the average of the diamond, the Mo, and the copper matrix. Additionally, it would have a porous structure such that the stresses that did accumulate during cooling from the sintering temperatures as a result of CTE mismatch would be mitigated by allowing strains to occur locally within the porous structure. It is desirable to build in a mechanical means, such as just described utilizing porosity, of minimizing the impact of the CTE difference between the composite and the Si.

Another embodiment would utilize transient liquid metal alloys for the one-time formation of a matrix filling. For instance, rather than using pure copper as the matrix 4$a$ which would require a temperature of 800 C to fuse, a Sn outer shell over a Cu coating on each of the 3$x$ and 3$y$ particle types would allow a one-time low melting process that would result in a higher melting alloy.

One may also consider some fabrication sequence variations. In a vias last approach, the Si wafer is fully built according to normal semiconducting fabrication processing. However, before it is diced to singularize into chips, deep blind vias or trenches are drilled into the back of the wafer by means of reactive ion etching. These are then processed to line the vias with a barrier layer, such as TaN to prevent migration of elements into the active Si which could poison semiconducting device operation. Once such a barrier layer had been formed, the vias could be filled with a composite paste, dried, sintered, and then sealed. The sintering temperature would have to be high enough for allow formation of a continuous porous solid, but be low enough that the barrier layer remains intact. An example would be a temperature of 650 C utilizing a system of Sn outer layer, Cu mid layer, and then appropriate 3$x$ and 3$y$ cores such as Mo and diamond and a TaN liner.

In a vias first approach, a blank wafer would be patterned with deep vias or trenches, and filled with a composite consisting of 3$x$ and 3$y$ particles coated with a high melting metal that was highly thermally conductive but not poisonous to the semiconductor. A high melting metal could be used because the wafer is still raw without any sensitive electronic component devices. This wafer would be sintered, cooled, cleaned and then processed as a normal semiconductor wafer to dope and circuitize.

The thermal advantage of having via structures with high heat capacity has been demonstrated by finite element modeling. There will be found some optimum combination of thermal conductivity and heat capacity, while maintaining a CTE low enough to prevent Si cracking. Among likely design rules which bind the possible combinations of materials is the requirement that the 4$a$ material be highly thermally conductive regardless of its heat capacity. This way nodules of high heat capacity material can be linked to this thermal conduit through a short path length. The 3$y$ component is most naturally diamond and is added to increase the average thermal conductivity while contributing to a low CTE. The requirement for a low overall CTE prevents, or makes less favorable, a two material system 4$a$+3$x$ relative to the 4$a$+3$x$+3$y$ composite. An example of this less desirable two material combination would be Mo dispersed in a matrix 4$a$ of copper. Copper has the desirable thermal conductivity, but its CTE is very large. Conversely, it would be difficult to make a hypothetical two material composite with diamond as the matrix 4$a$ and Mo as the 3$x$ material because there is no known way to fuse the diamond together as there would be with Cu. Thus, the three (or higher) component system brings significant advantage.

Further, the 3$x$ material could be chosen to undergo a phase change at some particular temperature to additionally moderate thermal spikes. For instance, if a typical chip operating temperature was 100 C, and spikes were known to occur to 120 C, this material could be chosen to be a metal alloy that melts at 110 C. Because the 3$x$ material is fully encapsulated in the 4$a$ material, the 3$x$ material is isolated from other components and would remain so until the chip cooled and it again solidified. Thus, threshold behavior can be designed into the composite with respect to its Cv vs T behavior, and thus with respect to its overall thermal spreading capabilities vs T.

While changes and variations to the embodiments may be made by those skilled in the semiconductor field, the scope of the invention is to be determined by the appended claims.

What is claimed is:

1. A microelectronic device comprising:

a semiconductor substrate;

a heat generating component disposed in a layer of said semiconductor substrate; and a body disposed in said semiconductor substrate, said body not being entirely outside said semiconductor substrate and said body being outside said layer, said body comprising a via hole filled with a solid composite material comprising at least first and second materials, the first material having a thermal inertia substantially higher than said semiconductor substrate and the second material having a thermal conductivity substantially higher than said semiconductor substrate.

2. A microelectronic device as recited in claim 1, further comprising a barrier layer disposed between said silicon substrate and said body, wherein said barrier layer is operable to shield against electrical interference with functioning of said microelectronic device.

3. A microelectronic device as recited in claim 2, wherein the barrier layer comprises TaN.

4. A microelectronic device as recited in claim 1, wherein said body is locally arranged according to the location of said heat generating component.

5. A microelectronic device as recited in claim 1, wherein said composite material of said body has thermal expansion properties substantially similar to those of said semiconductor substrate.

6. A microelectronic device as recited in claim 1, wherein said body is enclosed by said substrate.

7. A microelectronic device as recited in claim 1, wherein said body comprises a porous material.

8. A microelectronic device as recited in claim 1, wherein said via hole of said body is a blind via.

9. A microelectronic device as recited in claim 1, wherein said body is encompassed by said semiconductor substrate.

10. A microelectronic device as recited in claim 1, further comprising a cooling device thermally coupled to the body, wherein said cooling device comprises a heat sink.

11. A microelectronic device comprising:

a semiconductor substrate comprising an active surface layer and a non-active bulk layer;

a plurality of heat generating devices formed in the active surface layer of the semiconductor substrate; and a plurality of solid body elements formed in the non-active bulk layer of the semiconductor substrate, wherein the plurality if solid body elements are formed in a non-uniform arrangement over the non-active bulk layer so that the solid body elements are disposed locally in proximity to heat generating devices in the active surface layer, the plurality of solid body elements being adapted and arranged to (i) dissipate heat that is generated by the heat generating devices away from the active surface layer through the non-active bulk layer and to (ii) control temperature variation in the semiconductor substrate.

12. A microelectronic device as recited in claim 11, wherein at least one body element comprises a via hole filled with a first material having a thermal inertia substantially higher than said semiconductor substrate.

13. A microelectronic device as recited in claim 12, wherein the at least one body element with the via hole filled with the first material is encapsulated in the non-active bulk layer.

14. A microelectronic device as recited in claim 11, wherein at least one body element comprises a via hole filled with a second material having a thermal conductivity greater than said semiconductor substrate.

15. A microelectronic device as recited in claim 14, wherein the at least one body element with the via hole filled with the second material comprises a blind via hole having a closed end adjacent to a heat generating device and a open end on a surface of the non-active bulk layer.

* * * * *